United States Patent
Yuki et al.

(10) Patent No.: US 7,196,563 B2
(45) Date of Patent: Mar. 27, 2007

(54) COMPARATOR AND AD CONVERSION CIRCUIT HAVING HYSTERESIS CIRCUIT

(75) Inventors: Hirofumi Yuki, Kyoto (JP); Yasunori Kawamura, Kyoto (JP)

(73) Assignee: Rohm Co., Ltd. (JP)

( * ) Notice: Subject to any disclaimer, the term of this patent is extended or adjusted under 35 U.S.C. 154(b) by 80 days.

(21) Appl. No.: 11/061,224

(22) Filed: Feb. 18, 2005

(65) Prior Publication Data

US 2005/0184762 A1  Aug. 25, 2005

(30) Foreign Application Priority Data

Feb. 20, 2004 (JP) ............................ 2004-044913
Jan. 24, 2005 (JP) ............................ 2005-015642

(51) Int. Cl.
  *H03K 3/00* (2006.01)
(52) U.S. Cl. ...................................... 327/205; 327/206
(58) Field of Classification Search ................ 327/205, 327/206
See application file for complete search history.

(56) References Cited

U.S. PATENT DOCUMENTS 4,546,324 A * 10/1985 Bingham et al. ............. 330/9
4,547,683 A * 10/1985 Bingham ....................... 327/3
5,617,053 A *  4/1997 Shou et al. .................. 327/361
5,708,384 A *  1/1998 Shou et al. .................. 327/356
6,806,745 B2* 10/2004 Fujimoto ...................... 327/94

FOREIGN PATENT DOCUMENTS

JP          5-167400           7/1993

* cited by examiner

*Primary Examiner*—Kenneth B. Wells
(74) *Attorney, Agent, or Firm*—Cantor Colburn LLP

(57) ABSTRACT

A comparator is provided, which compares an input voltage and a reference voltage by using a plurality of inverting circuits connected in series. The comparator includes a first inverting circuit, a second inverting circuit, a feedback path, and a capacitor arranged on the feedback path. The first inverting circuit inverts a difference between the input voltage and the reference voltage for output. The second inverting circuit further inverts the output of the first inverting circuit for output. The feedback path feeds back the output of the second inverting circuit to the input side of the first inverting circuit. The capacitor causes hysteresis such that an increasing threshold and a decreasing threshold of the second inverting circuit corresponding to an increase and a decrease of the input voltage have a difference therebetween.

20 Claims, 8 Drawing Sheets

COMPARATOR AND AD CONVERSION CIRCUIT HAVING HYSTERESIS CIRCUIT

BACKGROUND OF THE INVENTION

1. Field of the Invention

The present invention relates to a comparator, an AD conversion circuit, a semiconductor device, and an image capturing apparatus. In particular, the invention relates to the technology of a hysteresis circuit to be formed in a comparator and an AD conversion circuit.

2. Description of the Related Art

Conventionally, some comparators for use in multi-bit AD conversion circuits have incorporated a hysteresis circuit for reducing noise effect for the sake of improved operation stability (for example, see Japanese Patent Laid-Open Publication No. Hei 5-167400). The reason is that in multi-bit AD conversion circuits beyond 10 bits in particular, the increasing number of bits makes bit-by-bit voltage steps smaller and thus increases the possibility of noise-induced malfunctions. The conventional hysteresis circuit switches its reference voltage to a voltage value higher than a threshold when its input voltage increases and switches the reference voltage to a voltage value lower than the threshold when the input voltage decreases. Thus, even if the input voltage fluctuates in value near the threshold, the output will not alternate between high level and low level. As a result, stable output is obtained.

Nevertheless, there has been the disadvantage that the conventional multi-bit AD conversion circuits have a plurality of switches, such as transistors, for realizing the hysteresis circuit, with an increase in circuit scale accordingly. There has also been the possibility that the increased number of switches can complicate the design and control.

SUMMARY OF THE INVENTION

In view of the foregoing, the inventor has achieved the present invention. It is thus an object of the invention to realize a hysteresis circuit of simple configuration and achieve a comparator of higher stability.

To solve the foregoing problems, a comparator according to one of the aspects of the present invention compares an input voltage and a reference voltage by using a plurality of inverting circuits connected in series. The comparator comprises: a first inverting circuit which inverts and outputs a difference between the input voltage and the reference voltage; a second inverting circuit which further inverts and outputs the output of the first inverting circuit; a feedback path which feeds back the output of the second inverting circuit to the input side of the first inverting circuit; and a capacitor which is arranged on the feedback path, and causes hysteresis such that an increasing threshold and a decreasing threshold of the second inverting circuit corresponding to an increase and a decrease of the input voltage have a difference therebetween.

Here, the "increasing threshold" refers to a threshold voltage at which the output of the second inverting circuit starts to increase with the increasing input voltage. The "decreasing threshold" refers to a threshold voltage at which the output of the second inverting circuit starts to decrease with the decreasing input voltage. According to this aspect, it is possible to increase the difference between the input voltage and the reference voltage slightly by push-up through the capacitor which functions as a hysteresis circuit. This can reduce noise effect since the output voltage will not vary even when the input voltage makes small fluctuations near the thresholds. Moreover, since all that is required is to provide the capacitor, it is possible to achieve an easy-to-control hysteresis circuit with the simple configuration.

Another aspect of the present invention is an AD conversion circuit. This AD conversion circuit converts an analog signal into a digital signal by using a plurality of comparators, the comparators each comparing an input voltage and a reference voltage by using a plurality of inverting circuits connected in series. The plurality of comparators each comprise: a first inverting circuit which inverts and outputs a difference between the input voltage and the reference voltage; a second inverting circuit which further inverts and outputs the output of the first inverting circuit; a feedback path which feeds back the output of the second inverting circuit to the input side of the first inverting circuit; and a capacitor which is arranged on the feedback path and causes hysteresis such that an increasing threshold and a decreasing threshold of the second inverting circuit corresponding to an increase and a decrease of the input voltage have a difference therebetween.

According to this aspect, this AD conversion circuit can increase the difference between the input voltage and the reference voltage slightly by push-up through the capacitor which functions as a hysteresis circuit. Since the output voltage will not vary even when the input voltage makes small fluctuations near the thresholds, it is possible to reduce noise effect for higher AD conversion accuracy. Moreover, since all that is required is to provide the capacitor, it is possible to achieve an easy-to-control hysteresis circuit with the simple configuration.

This AD conversion circuit having the comparators may be implemented on CCDs, or CCD-based image capturing apparatuses and scanners. The AD conversion circuit may also be implemented on a DVD drive.

Incidentally, any combinations of the foregoing components, and the components and expressions of the present invention replaced with methods, apparatuses, circuits, and the like mutually are also intended to constitute applicable aspects of the present invention.

DETAILED DESCRIPTION OF THE INVENTION (First Embodiment)

Conventional hysteresis circuits were achieved by switching the reference voltages to be input to their comparators.

That is, it was necessary to provide at least two possible reference voltage signals, and a plurality of switches for switching the same. Those switches were analog switches, and thus had to be reduced in impedance as much as possible. For example, for AD conversion on a voltage value of 1 $V_{pp}$ in 10 bits of resolution, 1 LSB was 0.98 mV. For AD conversion in 12 bits of resolution, 1 LSB=0.24 mV. Consequently, the greater the number of bits was, the smaller the bit-by-bit steps became in width. This facilitated noise-induced errors accordingly, with a drop in the conversion accuracy of the lower bits.

In the present embodiment, a hysteresis circuit is achieved by the configuration of applying pulses to an input stage of a chopper type comparator. As a result, small hysteresis can be realized by the simple configuration without providing a plurality of switches as a hysteresis circuit. In particular, since the hysteresis circuit can be turned on and off by a logic circuit, it is possible to suppress the circuit area small. In addition, smaller hysteresis can be achieved easily by trimming capacitances.

In the present embodiment, description will be given with an image capturing apparatus having the hysteresis circuit and the comparator as an example.

Figure 1:
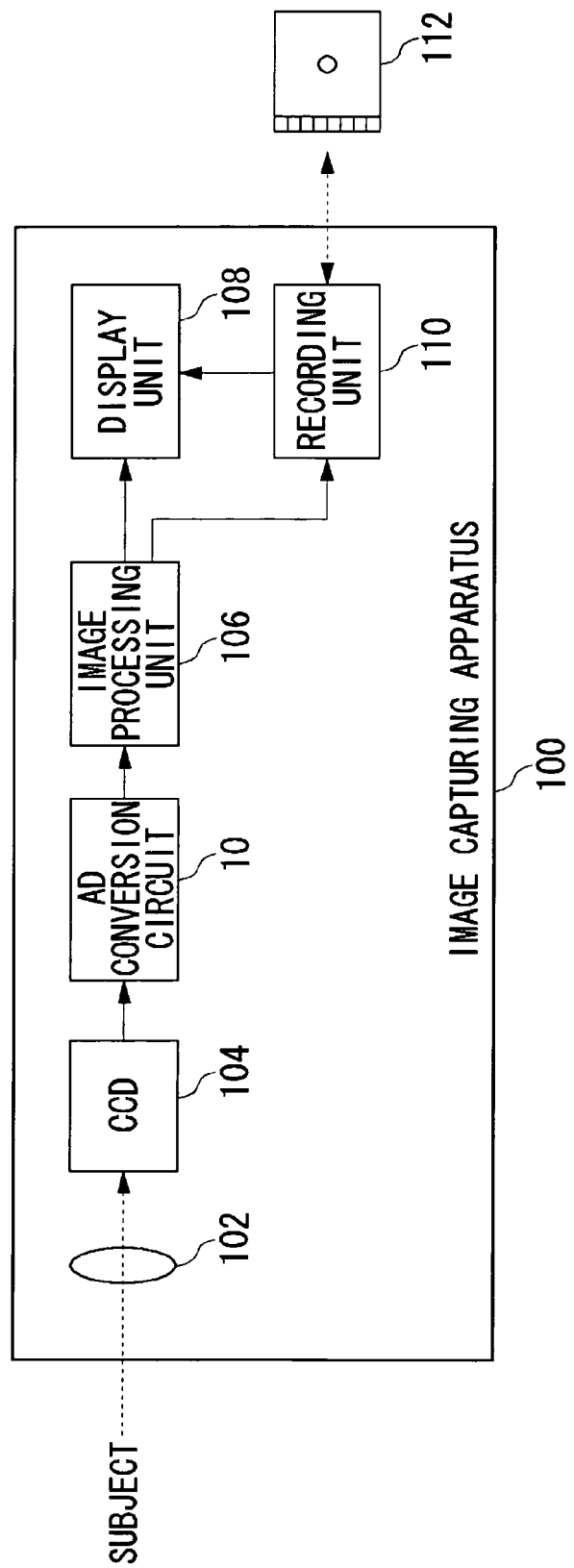
FIG. 1 is a diagram showing the basic configuration of an image capturing apparatus.

FIG. 1 shows the basic configuration of the image capturing apparatus. The image capturing apparatus 100 comprises a lens 102, a CCD 104, an AD conversion circuit 10, an image processing unit 106, a display unit 108, and a recording unit 110. The CCD 104 acquires the image of a subject through the lens 102 optically, and converts it into an electric signal. The AD conversion circuit 10 converts the analog electric signal received from the CCD 104 into digital values. The image processing unit 106 corrects the digital values received from the AD conversion circuit 10, and generates a digital image. The display unit 108 displays the captured digital image on-screen. The recording unit 110 records the captured digital image onto a memory card 112 which is loaded from exterior.

Figure 2:
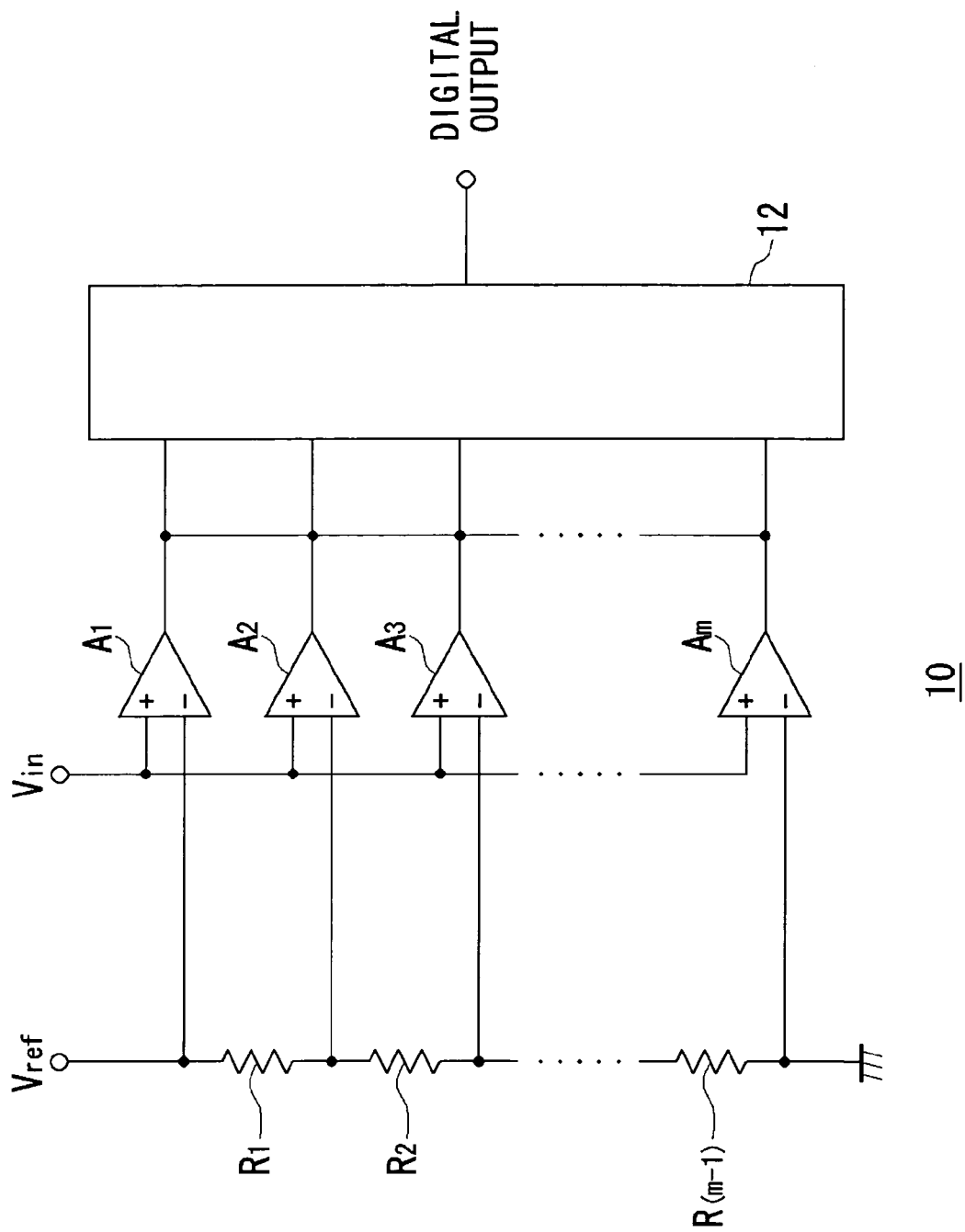
FIG. 2 is a diagram showing the configuration of an AD conversion circuit according to a first embodiment.

FIG. 2 shows the configuration of the AD conversion circuit according to the first embodiment. This AD conversion circuit 10 is a flash type (parallel comparison type) AD conversion circuit. For example, when the circuit is intended for AD conversion in n bits of resolution, $2^{n-1}$ (hereinafter, referred to as m) comparators, or a first to mth comparators $A_1$ to $A_m$, are connected in parallel between the input path of an input voltage $V_{in}$ and that of a reference voltage $V_{ref}$. The voltage between the reference voltage $V_{ref}$ and a ground potential is divided by (m-1) resistors $R_1$ to $R_{(m-1)}$. The divided voltages are input to the comparators $A_1$ to $A_m$ as respective reference voltages in descending order of the potentials. The differences between these reference voltages and the input voltage $V_{in}$ are output from the first to mth comparators $A_1$ to $A_m$ as the results of comparison, respectively. An encoder 12 converts the results of comparison output from the respective first to mth comparators $A_1$ to $A_m$ into an n-bit digital signal for output. The AD conversion circuit 10 thus determines which comparator has the reference voltage coinciding with the input voltage $V_{in}$ in value, out of the first to mth comparators $A_1$ to $A_m$, instantaneously.

Figure 3:
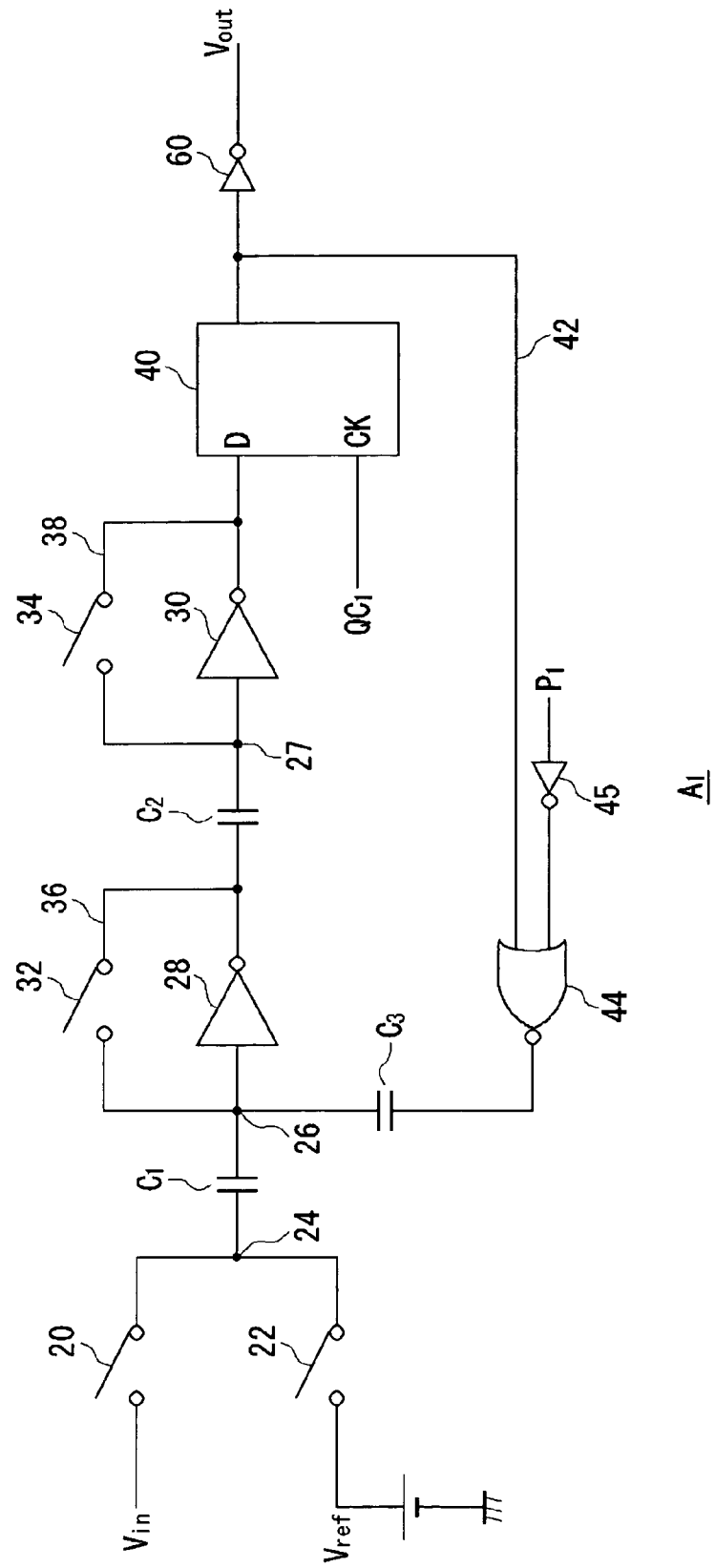
FIG. 3 is a circuit diagram theoretically showing the configuration of comparators included in the AD conversion circuit.

FIG. 3 is a circuit diagram theoretically showing the configuration of the comparators included in the AD conversion circuit. This diagram shows the first comparator $A_1$ of FIG. 2. The second to mth comparators $A_2$ to $A_m$ have the same configuration as that of the first comparator $A_1$. The first comparator $A_1$ chiefly includes a first inverting circuit 28, a second inverting circuit 30, a latch circuit 40, a NOR circuit 44, and a fourth inverting circuit 45. The first inverting circuit 28 and the second inverting circuit 30 are arranged in series. The input terminal of the first inverting circuit 28 is connected to one end of a first capacitor $C_1$. The first capacitor $C_1$ has a capacitance of 5 pF, for example, and is connected to a first node 24 at the other end. The output terminal of the first inverting circuit 28 is connected to one end of a second capacitor $C_2$. The other end of the second capacitor $C_2$ is connected to the input terminal of the second inverting circuit 30. The output of the second inverting circuit 30 is input to the latch circuit 40. The output of the latch circuit 40 is input to the NOR circuit 44 via a third feedback path 42, and is also inverted and output as $V_{out}$ by a third inverting circuit 60. The NOR circuit 44 also receives a timing signal $P_1$ that is inverted by the fourth inverting circuit 45.

When the timing signal $P_1$ is low, the NOR circuit 44 always outputs low. When the timing signal $P_1$ is high, the NOR circuit 44 outputs low if the output of the latch circuit 40 is high, and outputs high if the output of the latch circuit 40 is low. A third capacitor $C_3$ is interposed between the output terminal of the NOR circuit 44 and the input terminal of the first inverting circuit 28. The third capacitor $C_3$ may be a small capacitor, for example, on the order of 0.0005 pF. Parasitic capacitances such as the gate capacitor of a transistor and an aluminum-to-aluminum capacitance may also be used.

The input voltage $V_{in}$ is applied to the first node 24 through a first switch 20. The reference voltage $V_{ref}$ is applied to the first node 24 through a second switch 22. The output of the first inverting circuit 28 is fed back to a second node 26, which establishes the connection between the input terminal of the first inverting circuit 28 and the first capacitor $C_1$, through a third switch 32. Similarly, the output of the second inverting circuit 30 is fed back to a third node 27, which establishes the connection between the input terminal of the second inverting circuit 30 and the second capacitor $C_2$, through a fourth switch 34. The first inverting circuit 28 inverts and outputs a signal input thereto. This output signal is further inverted and output by the second inverting circuit 30.

Description will now be given of the operation of the first comparator $A_1$. In an initialization operation on this circuit, all of the second switch 22, the third switch 32, and the fourth switch 34 are turned on. In the meantime, the first inverting circuit 28 and the second inverting circuit 30 settle down at values ½ their output ranges because their outputs, or inverted inputs, are fed back. Given a power supply voltage of 3 V, the first inverting circuit 28 and the second inverting circuit 30 settle down at 1.5 V, or at the midpoints in their output ranges. When the second switch 22, the third switch 32, and the fourth switch 34 are turned off, the potential of the first node 24 and the potential of the second node 26 are held at the voltage value of the reference voltage $V_{ref}$ and at 1.5 V, respectively.

In a comparison operation, the first switch 20 is turned on to apply the input voltage $V_{in}$. The potential of the first node 24 varies as much as a difference between the reference voltage $V_{ref}$ and the input voltage $V_{in}$, or $\Delta V = V_{ref} - V_{in}$. Where the third capacitor $C_3$ and the potential difference across the same are negligible, the potential of the second node 26 is pushed up or down from 1.5 V by $\Delta V$, or into 1.5 V+$\Delta V$. When this $\Delta V$ has a positive value, the first inverting circuit 28 outputs low. When $\Delta V$ has a negative value, the first inverting circuit 28 outputs high. The second inverting circuit 30 inverts the output of the first inverting circuit 28 further. Eventually, $V_{out}$ becomes high when $\Delta V$ has a positive value, and $V_{out}$ becomes low when $\Delta V$ has a negative value. The latch circuit 40 outputs a value based on the signal input from the second inverting circuit 30 when a clock signal $QC_1$ is high. More specifically, when the second inverting circuit 30 outputs high, the latch circuit 40 outputs low. When the second inverting circuit 30 outputs low, the latch circuit 40 outputs high. Note that when the output of the second inverting circuit 30 is 1.5 V, the output of the latch circuit 40 is kept at the previous output value.

The timing signal $P_1$ is low during the initialization operation, and high during the comparison operation. Thus, the NOR circuit 44 always outputs low in the initialization operation. In the comparison operation, the NOR circuit 44 outputs low when the output of the latch circuit 40 is high, and outputs high when the output of the latch circuit 40 is low. When the output voltage $V_{out}$ is high, the output of the latch circuit 40 is low. When the timing signal $P_1$ becomes high, the latch circuit 40 outputs high, so that the potential of the third capacitor $C_3$ on the side of the NOR circuit 44 is low. Consequently, when the output voltage $V_{out}$ changes from high to low, the potential of the third capacitor $C_3$ on the side of the NOR circuit 44 remains low. This precludes the second node 26 from being pushed up in potential. On the other hand, when the output voltage $V_{out}$ changes from low to high, the potential of the third capacitor $C_3$ on the side of the NOR circuit 44 is switched from low to high. This pushes up the potential of the second node 26 by an amount corresponding to the capacitance of the third capacitor $C_3$, or a small voltage $\Delta Vx$. This gives the second node 26 a potential of $1.5+\Delta V+\Delta Vx$, thereby removing noise effect as much as $\Delta Vx$.

Figure 4:
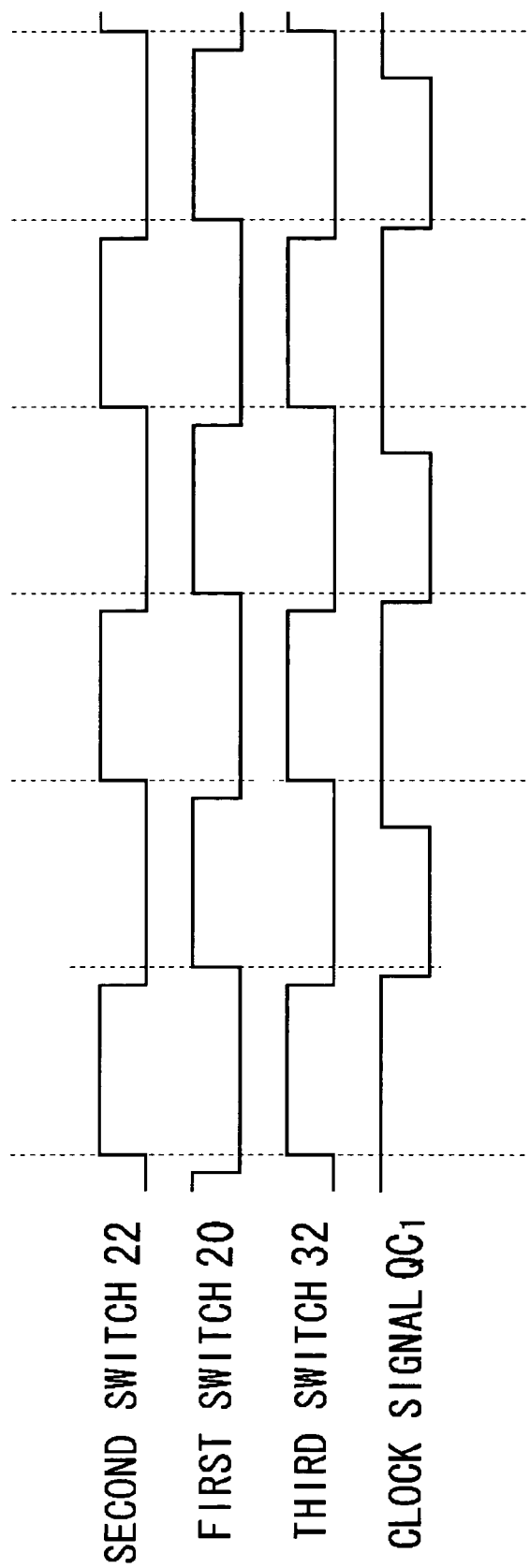
FIG. 4 is a timing chart showing initialization operations and comparison operations.

FIG. 4 is a timing chart showing the initialization operations and the comparison operations. The chart shows, in descending order, the on-off timing of the second switch 22, the first switch 20, the third switch 32, and the clock signal $QC_1$. Initially, when the second switch 22 and the third switch 32 are turned on, the first inverting circuit 28 starts the initialization operation. When the second switch 22 and the third switch 32 are turned off, the first inverting circuit 28 ends the initialization operation. The clock signal $QC_1$ is then turned off, and the first switch 20 on. While the first switch 20 is turned on, the comparison operation is performed on the input voltage $V_{in}$ and the reference voltage $V_{ref}$. Before the first switch 20 is turned off, the clock signal $QC_1$ is turned on to output the output voltage $V_{out}$ from the latch circuit 40. When the first switch 20 is turned off, the second switch 22 and the third switch 32 are turned on to start the next initialization operation. The initialization operation and the comparison operation are repeated in this way.

Figure 5:
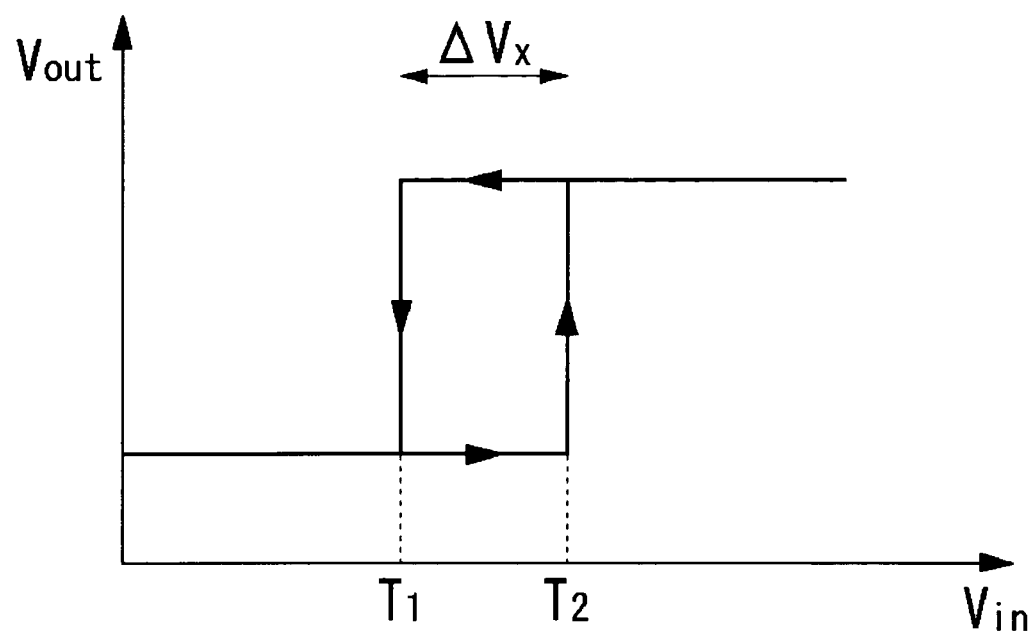
FIG. 5 is a graph showing the hysteresis occurring between the input voltage and the output voltage.

FIG. 5 shows the hysteresis occurring between the input voltage and the output voltage. When the input voltage Vin exceeds a threshold $T_2$ and the output voltage $V_{out}$ changes from low to high, the output voltage $V_{out}$ will not switch from high to low even if the input voltage $V_{in}$ falls below the threshold $T_2$. When the input voltage $V_{in}$ keeps falling to below a threshold $T_1$, the output voltage $V_{out}$ switches from high to low. Subsequently, the output voltage $V_{out}$ remains low even if the input voltage $V_{in}$ rises to above the threshold $T_1$. When the input voltage $V_{in}$ exceeds the threshold $T_2$, the output voltage $V_{out}$ switches from low to high. As can be seen, the thresholds $T_1$ and $T_2$ have a difference of $\Delta Vx$, which is a voltage value corresponding to the third capacitor $C_3$. This $\Delta Vx$ constitutes the hysteresis dead zone, in which the input voltage $V_{in}$ varies without switching the output voltage $V_{out}$. Here, the output voltage $V_{out}$ is kept at the previous value, either high or low.

As described above, the first comparator $A_1$ operates without changing the value of the reference voltage $V_{ref}$ itself. Instead, the first comparator $A_1$ operates such that the threshold $T_2$ of the input voltage $V_{in}$ in switching the output voltage $V_{out}$ from low to high and the threshold $T_1$ of the input voltage $V_{in}$ in switching the same from high to low have different values from each other. This causes hysteresis near the reference voltage $V_{ref}$, so that small variations in the input voltage $V_{in}$ between the thresholds $T_1$ and $T_2$, ascribable to noise, have no effect on the output voltage $V_{out}$ any longer. The width of the difference between $T_1$ and $T_2$ depends on the value of the third capacitor $C_3$. The third capacitor $C_3$, however, need not have a strictly-determined value in terms of circuit design, but may be given only some small value for a corresponding effect. Consequently, the hysteresis circuit of the present embodiment has the design facility that the third capacitor $C_3$ and the NOR circuit 44 have only to be provided chiefly. The circuit area can thus be suppressed smaller. Moreover, since the operation is under the control of the NOR circuit 44, it is possible to exercise control easily with the configuration simpler than that of conventional hysteresis circuits using analog switches.

(Second Embodiment)

Figure 6:
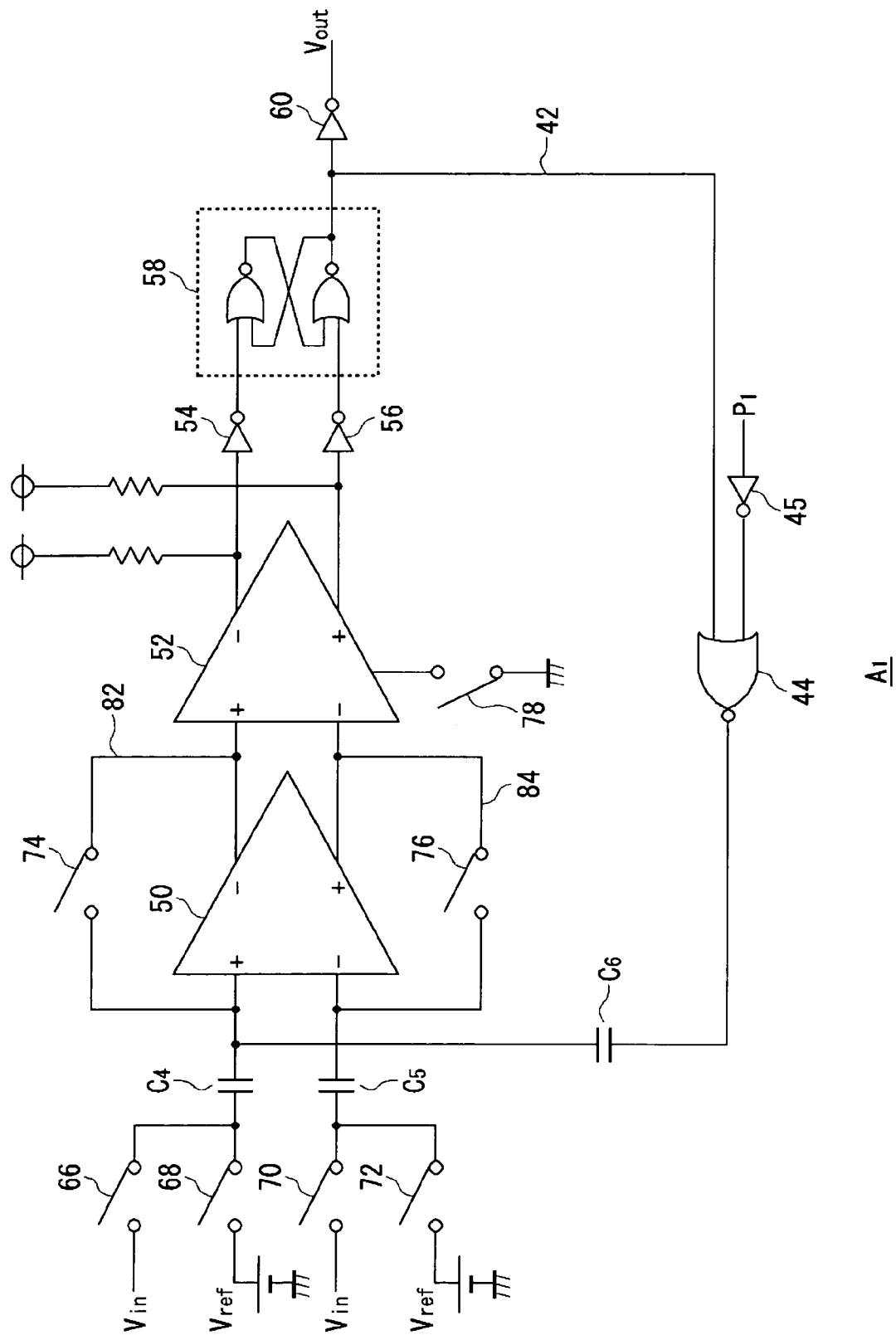
FIG. 6 is a diagram showing the configuration of a comparator according to a second embodiment.

Comparators according to the present embodiment make basically the same operations as those of the comparators according to the first embodiment. Note that the comparators of the present embodiment, as shown in FIG. 6, are configured to include differential amplifiers. In other respects than the comparators, the present embodiment has the same circuit configuration as in the first embodiment. Description thereof will thus be omitted.

FIG. 6 shows the configuration of a comparator according to the second embodiment. In the first comparator $A_1$, a first differential amplifier 50 and a second differential amplifier 52 are arranged in series. The first differential amplifier 50 corresponds to the first inverting circuit 28 in FIG. 3, and has differential input terminals and inverted differential output terminals. Similarly, the second differential amplifier 52 corresponds to the second inverting circuit 30 in FIG. 3, and has differential input terminals and inverted differential output terminals.

The differential outputs of the second differential amplifier 52 are inverted by a fifth inverting circuit 54 and a sixth inverting circuit 56, respectively, and input to an RS latch circuit 58. These circuits, namely, the fifth inverting circuit 54, the sixth inverting circuit 56, and the RS latch circuit 58 chiefly correspond to the latch circuit 40 of FIG. 3. Note that the clock signal $QC_1$ input to the latch circuit 40 corresponds, in FIG. 6, to an eleventh switch 78 for turning on and off the power supply of the second differential amplifier 52. The output of the RS latch circuit 58 is inverted into an output voltage $V_{out}$ by a third inverting circuit 60.

The output of the RS latch circuit 58 is input to a NOR circuit 44 via a third feedback path 42. The NOR circuit 44 outputs the logic NOR between the output of the RS latch circuit 58 and a signal obtained by inverting a timing signal $P_1$ through a fourth inverting circuit 45. The NOR circuit 44 and the fourth inverting circuit 45 correspond to the NOR circuit 44 and the fourth inverting circuit 45 of FIG. 3. A sixth capacitor $C_6$ is arranged on the path that establishes connection between the NOR circuit 44 and an input terminal of the first differential amplifier 50. The sixth capacitor $C_6$ corresponds to the third capacitor $C_3$ of FIG. 3. The input voltage $V_{in}$ is differentially input through a fifth switch 66 and a seventh switch 70. The reference voltage $V_{ref}$ is differentially input through a sixth switch 68 and an eighth switch 72. The fifth switch 66 and the seventh switch 70 correspond to the first switch 20 of FIG. 3. The sixth switch 68 and the eighth switch 72 correspond to the second switch 22 of FIG. 3.

The differential input terminals of the first differential amplifier 50 are in connection with a fourth capacitor $C_4$ and a fifth capacitor $C_5$, respectively. The fourth capacitor $C_4$ and the fifth capacitor $C_5$ correspond to the first capacitor $C_1$ of FIG. 3. The differential output terminals and the differential input terminals of the first differential amplifier 50 are connected to a fourth feedback path 82 and a fifth feedback path 84, which correspond to the first feedback path 36 of FIG. 3. A ninth switch 74 and a tenth switch 76, formed on the fourth feedback path 82 and the fifth feedback path 84, correspond to the third switch 32 of FIG. 3.

The circuits described above operate theoretically the same as the first comparator $A_1$ shown in FIG. 3 does. Description of the detailed operations will thus be omitted. This configuration can also achieve an easy-to-control hysteresis circuit of simple configuration as in the first embodiment.

(Third Embodiment)

An AD conversion circuit according to the present embodiment is a pipelined AD conversion circuit.

Figure 7:
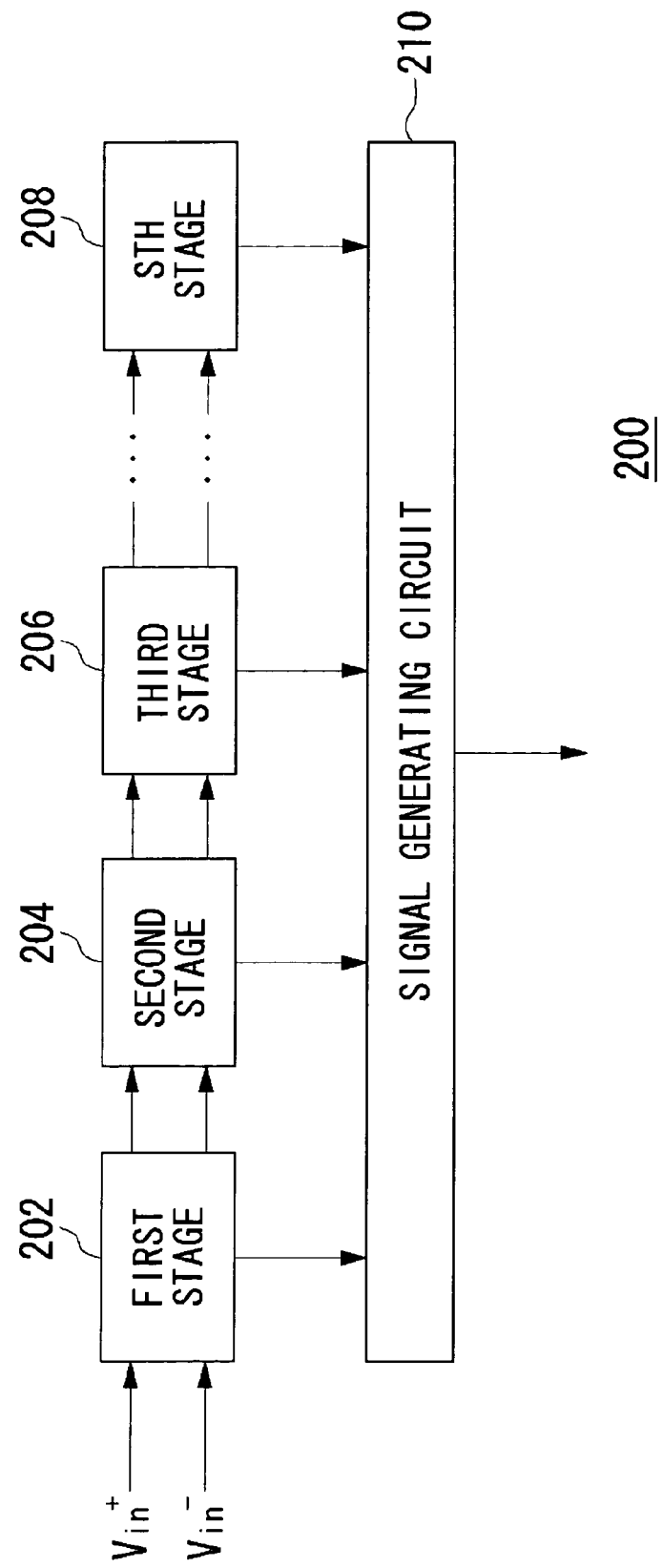
FIG. 7 is a diagram showing the configuration of an AD conversion circuit according to a third embodiment.

FIG. 7 shows the configuration of the AD conversion circuit according to the third embodiment. The AD conversion circuit 200 is composed of s stages, which process AD conversion in several bits each. Here, the AD conversion circuit 200 includes a first stage 202, a second stage 204, a third stage 206, . . . , an sth stage 208. The first stage 202 converts input voltages $V_{in}^+$ and $V_{in}^-$ into several bits of digital value, and transmits it to a signal generating circuit 210. The first stage 202 also subtracts the converted values from the original input values, amplifies the resultants, and transmits them to the second stage 204. Similarly, the second stage 204 converts the input values into several bits of digital value, and transmits it to the signal generating circuit 210. The second stage 204 subtracts the converted values from the original input values, amplifies the resultants, and transmits them to the third stage 206. The third stage 206 also converts the input values into several bits of digital value, and transmits it to the signal generating circuit 210. The third stage 206 subtracts the converted values from the original input values, amplifies the resultants, and transmits them to the next stage. The final stage, or sth stage 208, converts the input values into several bits of digital value, and transmits it to the signal generating circuit 210.

While the values past the conversion by the first stage 202 are subjected to the AD conversion in the second stage 204, the first stage 202 performs an AD conversion on the next input values. In this way, the first stage 202, the second stage 204, the third stage 206, . . . , the sth stage 208 process their respective AD conversions in parallel. The AD conversion in each stage includes processing of only several bits, such as four bits or less, and thus has high processing speed. Besides, the individual stages make simultaneous processing. The processing speed is thus improved as a whole. The digital signals output from the respective stages are collected by the signal generating circuit 210 for output.

Figure 8:
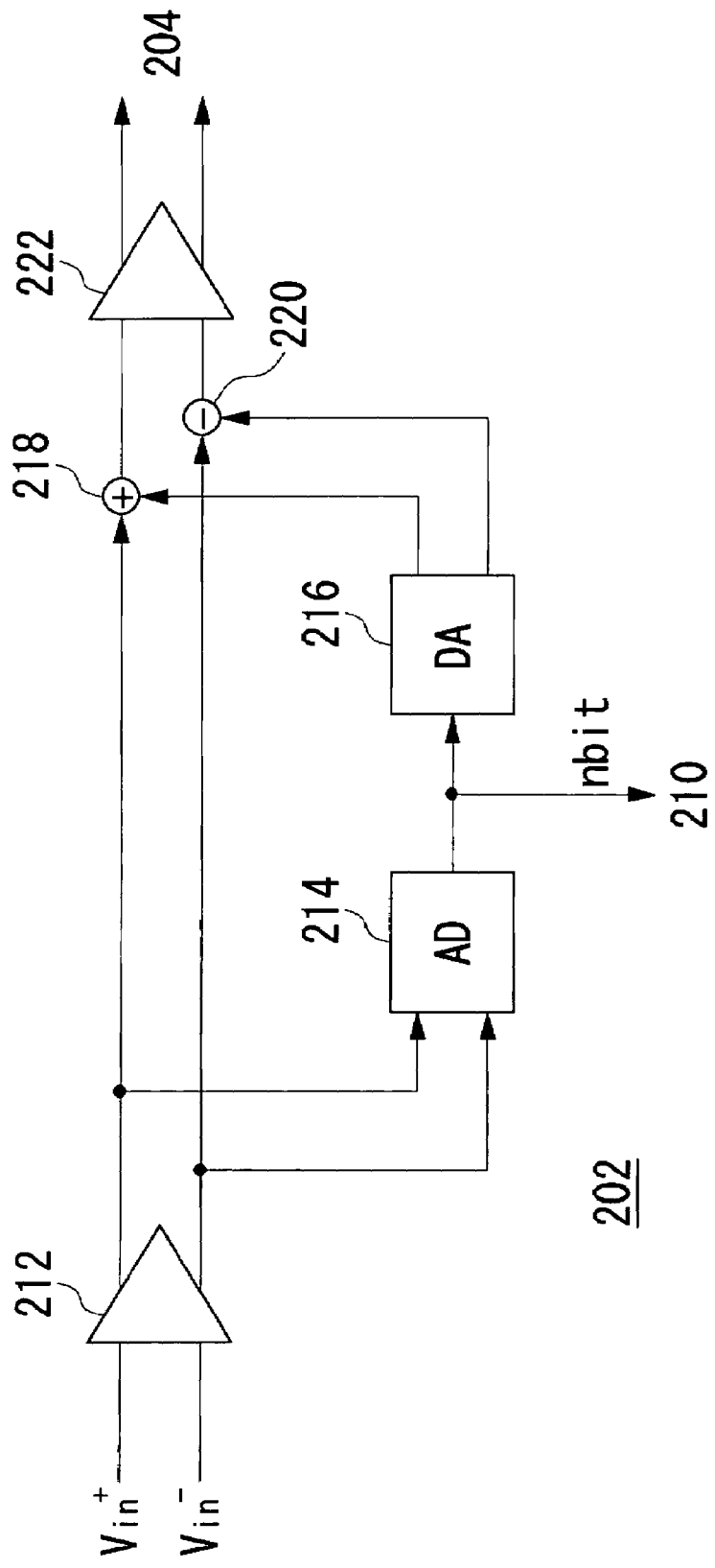
FIG. 8 is a diagram showing the detailed configuration of a first stage.

FIG. 8 shows the detailed configuration of the first stage. The first stage 202 includes a sample-and-hold circuit 212, a sub AD conversion circuit 214, a sub DA conversion circuit 216, a first subtracter 218, a second subtracter 220, and an amplifier 222. The input voltages $V_{in}^+$ and $V_{in}^-$ are differentially input to and held in the sample-and-hold circuit 212. The analog values held in the sample-and-hold circuit 212 are converted into n bits of digital value by the sub AD conversion circuit 214. The digital value is output to the signal generating circuit 210, as well as converted into analog values by the sub DA conversion circuit 216. The first subtracter 218 and the second subtracter 220 subtract the analog values converted by the sub DA conversion circuit 216 from the values held in the sample-and-hold circuit 212. The resultants are differentially input to the amplifier 222. The amplifier 222 amplifies the signals received from the first subtracter 218 and the second subtracter 220, and transmits the resultants to the next stage, or second stage 204.

The sub AD conversion circuit 214 is the same flash type AD conversion circuit as the AD conversion circuit 10 of FIG. 2. In spite of the different numbers of bits, the sub AD conversion circuit 214 makes the same operations as those of the AD conversion circuits 10 in the first and second embodiments. Consequently, the sub AD conversion circuit 214 can also achieve an easy-to-control hysteresis circuit of simple configuration as in the first and second embodiments.

Up to this point, the present invention has been described in conjunction with the embodiments thereof. These embodiments are given solely by way of illustration. It will be understood by those skilled in the art that various modifications may be made to combinations of the foregoing components and processes, and all such modifications are also intended to fall within the scope of the present invention. The following provides one of the modifications.

The foregoing embodiments have dealt with the control that the reference voltage $V_{ref}$ is applied in the initialization operation, and the input voltage $V_{in}$ is applied in the comparison operation. In a modification, the control may be such that the input voltage $V_{in}$ is applied in the initialization operation, and the reference voltage $V_{ref}$ is applied in the comparison operation.

What is claimed is:

1. A comparator which compares an input voltage and a reference voltage by using a plurality of inverting circuits connected in series, the comparator comprising:
    a main signal path which includes an input path in which an input voltage is supplied and an output path from which a result of comparison is output;
    a first inverting circuit which, provided in the main signal path, inverts and outputs a difference between the input voltage and the reference voltage;
    a second inverting circuit which, provided in the main signal path, further inverts and outputs the output of the first inverting circuit;
    a feedback path which, connected to the output path and the input path of the main signal path, feeds back the output of the second inverting circuit from the output path to the input path; and
    a capacitor which is arranged on the feedback path and causes hysteresis such that a first threshold at which the output of the second inverting circuit changes from high to low is different from a second threshold at which the output of the second inverting circuit changes from low to high.

2. The comparator according to claim 1, further comprising a circuit which is arranged on the feedback path and switches on or off the application of the output of the second inverting circuit to the capacitor.

3. The comparator according to claim 1, wherein
    the capacitor functions to increase the value of the difference between the input voltage and the reference voltage slightly when the output of the second inverting circuit changes from low level to high level.

4. The comparator according to claim 2, wherein
the capacitor functions to increase the value of the difference between the input voltage and the reference voltage slightly when the output of the second inverting circuit changes from low level to high level.

5. The comparator according to claim 1, further comprising:
a first switch which switches on and off the input of the input voltage to the first inverting circuit;
a second switch which switches on and off the input of the reference voltage to the first inverting circuit; and
a third switch arranged on a path which feeds back the output of the first inverting circuit to the input side of the first inverting circuit, the third switch switching on and off the feedback, and wherein
the output of the first inverting circuit settles down at an intermediate value in its voltage range when the first switch is off and the second and third switches are on, and takes the value of the difference between the input voltage and the reference voltage when the second and third switches are off and the first switch is on, and
the capacitor increases the value of the difference slightly while the input voltage is on the increase when the second and third switches are off and the first switch is on.

6. The comparator according to claim 2, further comprising:
a first switch which switches on and off the input of the input voltage to the first inverting circuit;
a second switch which switches on and off the input of the reference voltage to the first inverting circuit; and
a third switch arranged on a path which feeds back the output of the first inverting circuit to the input side of the first inverting circuit, the third switch switching on and off the feedback, and wherein
the output of the first inverting circuit settles down at an intermediate value in its voltage range when the first switch is off and the second and third switches are on, and takes the value of the difference between the input voltage and the reference voltage when the second and third switches are off and the first switch is on, and
the capacitor increases the value of the difference slightly while the input voltage is on the increase when the second and third switches are off and the first switch is on.

7. The comparator according to claim 3, further comprising:
a first switch which switches on and off the input of the input voltage to the first inverting circuit;
a second switch which switches on and off the input of the reference voltage to the first inverting circuit; and
a third switch arranged on a path which feeds back the output of the first inverting circuit to the input side of the first inverting circuit, the third switch switching on and off the feedback, and wherein
the output of the first inverting circuit settles down at an intermediate value in its voltage range when the first switch is off and the second and third switches are on, and takes the value of the difference between the input voltage and the reference voltage when the second and third switches are off and the first switch is on, and
the capacitor increases the value of the difference slightly while the input voltage is on the increase when the second and third switches are off and the first switch is on.

8. The comparator according to claim 4, further comprising:
a first switch which switches on and off the input of the input voltage to the first inverting circuit;
a second switch which switches on and off the input of the reference voltage to the first inverting circuit; and
a third switch arranged on a path which feeds back the output of the first inverting circuit to the input side of the first inverting circuit, the third switch switching on and off the feedback, and wherein
the output of the first inverting circuit settles down at an intermediate value in its voltage range when the first switch is off and the second and third switches are on, and takes the value of the difference between the input voltage and the reference voltage when the second and third switches are off and the first switch is on, and
the capacitor increases the value of the difference slightly while the input voltage is on the increase when the second and third switches are off and the first switch is on.

9. An AD conversion circuit which converts an analog signal into a digital signal by using a plurality of comparators, the comparators each comparing an input voltage and a reference voltage by using a plurality of inverting circuits connected in series, wherein
the plurality of comparators each comprise:
a main signal path which includes an input path in which an input voltage is supplied and an output path from which a result of comparison is ouput;
a first inverting circuit which, provided in the main signal path, inverts and outputs a difference between the input voltage and the reference voltage;
a second inverting circuit which, provided in the main signal path, further inverts and outputs the output of the first inverting circuit;
a feedback path which, connected to the output path and the input path of the main signal path, feeds back the output of the second inverting circuit from the output path to the input path; and
a capacitor which is arranged on the feedback channel and causes hysteresis such that a first threshold at which the output of the second inverting circuit changes from high to low is different from a second threshold at which the output of the second inverting circuit changes from low to high.

10. The AD conversion circuit according to claim 9, further comprising a circuit arranged on the feedback path, the circuit switching on and off the application of the output of the second inverting circuit to the capacitor.

11. The AD conversion circuit according to claim 9, wherein
the capacitor functions to increase the value of the difference between the input voltage and the reference voltage slightly when the output of the second inverting circuit changes from low level to high level.

12. The AD conversion circuit according to claim 10, wherein
the capacitor functions to increase the value of the difference between the input voltage and the reference voltage slightly when the output of the second inverting circuit changes from low level to high level.

13. The comparator according to claim 9, further comprising:
a first switch which switches on and off the input of the input voltage to the first inverting circuit;
a second switch which switches on and off the input of the reference voltage to the first inverting circuit; and a third switch arranged on a path which feeds back the output of the first inverting circuit to the input side of the first inverting circuit, the third switch switching on and off the feedback, and wherein the output of the first inverting circuit settles down at an intermediate value in its voltage range when the first switch is off and the second and third switches are on, and takes the value of the difference between the input voltage and the reference voltage when the second and third switches are off and the first switch is on, and the capacitor increases the value of the difference slightly while the input voltage is on the increase when the second and third switches are off and the first switch is on.

14. The comparator according to claim 10, further comprising:

a first switch which switches on and off the input of the input voltage to the first inverting circuit;

a second switch which switches on and off the input of the reference voltage to the first inverting circuit; and a third switch arranged on a path which feeds back the output of the first inverting circuit to the input side of the first inverting circuit, the third switch switching on and off the feedback, and wherein the output of the first inverting circuit settles down at an intermediate value in its voltage range when the first switch is off and the second and third switches are on, and takes the value of the difference between the input voltage and the reference voltage when the second and third switches are off and the first switch is on, and the capacitor increases the value of the difference slightly while the input voltage is on the increase when the second and third switches are off and the first switch is on.

15. The comparator according to claim 11, further comprising:

a first switch which switches on and off the input of the input voltage to the first inverting circuit;

a second switch which switches on and off the input of the reference voltage to the first inverting circuit; and a third switch arranged on a path which feeds back the output of the first inverting circuit to the input side of the first inverting circuit, the third switch switching on and off the feedback, and wherein the output of the first inverting circuit settles down at an intermediate value in its voltage range when the first switch is off and the second and third switches are on, and takes the value of the difference between the input voltage and the reference voltage when the second and third switches are off and the first switch is on, and the capacitor increases the value of the difference slightly while the input voltage is on the increase when the second and third switches are off and the first switch is on.

16. The comparator according to claim 12, further comprising:

a first switch which switches on and off the input of the input voltage to the first inverting circuit;

a second switch which switches on and off the input of the reference voltage to the first inverting circuit; and a third switch arranged on a path which feeds back the output of the first inverting circuit to the input side of the first inverting circuit, the third switch switching on and off the feedback, and wherein the output of the first inverting circuit settles down at an intermediate value in its voltage range when the first switch is off and the second and third switches are on, and takes the value of the difference between the input voltage and the reference voltage when the second and third switches are off and the first switch is on, and the capacitor increases the value of the difference slightly while the input voltage is on the increase when the second and third switches are off and the first switch is on.

17. A semiconductor device incorporating the comparator according to claim 1.

18. A semiconductor device incorporating the AD conversion circuit according to claim 9.

19. An image capturing apparatus comprising an AD conversion circuit which converts an analog signal into a digital signal by using a plurality of comparators, the comparators each comparing an input voltage and a reference voltage by using a plurality of inverting circuits connected in series, and wherein the plurality of comparators of the AD conversion circuit each comprise:

a main signal path which includes an input path in which an input voltage is supplied and an output path from which a result of comparison is output;

a first inverting circuit which, provided in the main signal path, inverts and outputs a difference between the input voltage and the reference voltage;

a second inverting circuit which, provided in the main signal path, further inverts and outputs the output of the first inverting circuit;

a feedback path which, connected to the output path and the input path of the main signal path, feeds back the output of the second inverting circuit from the output path to the input path; and a capacitor which is arranged on the feedback channel and causes hysteresis such that a first threshold at which the output of the second inverting circuit changes from high to low is different from a second threshold at which the output of the second inverting circuit changes from low to high.

20. An image capturing apparatus comprising:

a lens which forms an image of a subject;

a CCD which acquires the image of the subject through the lens optically and converts the same into an electric signal;

an AD conversion circuit which converts an analog electric signal received from the CCD into a digital value;

an image processing unit which corrects a digital value received from the AD conversion circuit, and generates a digital image;

a display unit which displays the digital image on-screen; and a recording unit which records the digital image, and wherein the AD conversion circuit converts the analog signal into a digital signal by using a plurality of comparators, the comparators each comparing an input voltage and a reference voltage by using a plurality of inverting circuits connected in series, and the plurality of comparators each comprise a main signal path which includes an input path in which an input voltage is supplied and an output path from which a result of comparison is output;

a first inverting circuit which, provided in the main signal path, invert and outputs a difference between the input voltage and the reference voltage, a second inverting circuit which, provided in the main signal path, further inverts and outputs the output of the first inverting circuit, a feedback path which, connected to the output path and the input path of the main signal path, feeds back the output of the second inverting circuit from the output path to the input path, and a capacitor which is arranged on the feedback channel and causes hysteresis such that a first threshold at which the output of the second inverting circuit changes from high to low is different from a second threshold at which the output of the second inverting circuit changes from low to high.

* * * * *